Figure 1:
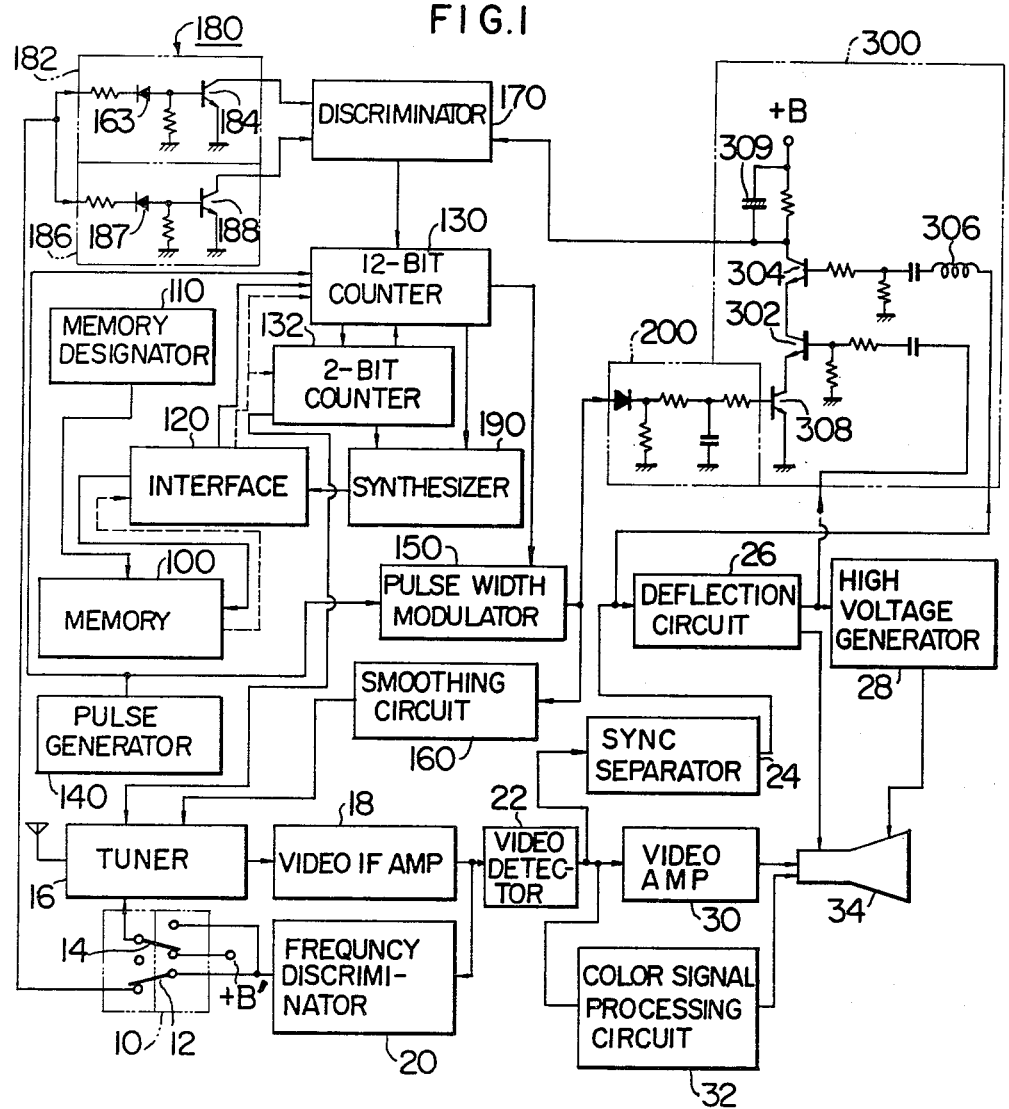

United States Patent [19]
Fushimi et al.

[11] 4,240,114
[45] Dec. 16, 1980

[54] CHANNEL SELECTION SYSTEM FOR TELEVISION RECEIVER

[75] Inventors: Kiyoshi Fushimi; Keizo Shimizu, both of Yokohama, Japan

[73] Assignee: Hitachi, Ltd., Japan

[21] Appl. No.: 918,450

[22] Filed: Jun. 23, 1978

[30] Foreign Application Priority Data

Jun. 27, 1977 [JP] Japan .................................. 52-75539

[51] Int. Cl.³ ............................................. H04N 5/44
[52] U.S. Cl. ................................................ 358/193.1
[58] Field of Search ...................... 358/191, 193, 195; 325/464, 468, 470

[56] References Cited
U.S. PATENT DOCUMENTS

| 3,388,215 | 6/1968 | Mayle | 358/193 |
| 3,610,817 | 10/1971 | Bridgewater | 325/470 |
| 3,825,838 | 7/1974 | Mayle | 358/195 |

Primary Examiner—Bernard Konick
Assistant Examiner—Joseph A. Popek
Attorney, Agent, or Firm—Craig and Antonelli

[57] ABSTRACT

When a receiving channel of television broadcast is selected by the frequency sweep, a video carrier and an audio carrier appear alternately at an output of an intermediate frequency (IF) stage. A channel selection system is disclosed, which distinguishes the video carrier and the audio carrier from each other by the presence or absence of a sync. separation pulse during the frequency sweep, in which a sync. pulse is distinguished from a noise pulse by the presence or absence of a horizontal flyback pulse and the video carrier is distinguished from the audio carrier in response to the presence or absence of the sync. pulse to selectively stop the sweep.

10 Claims, 4 Drawing Figures

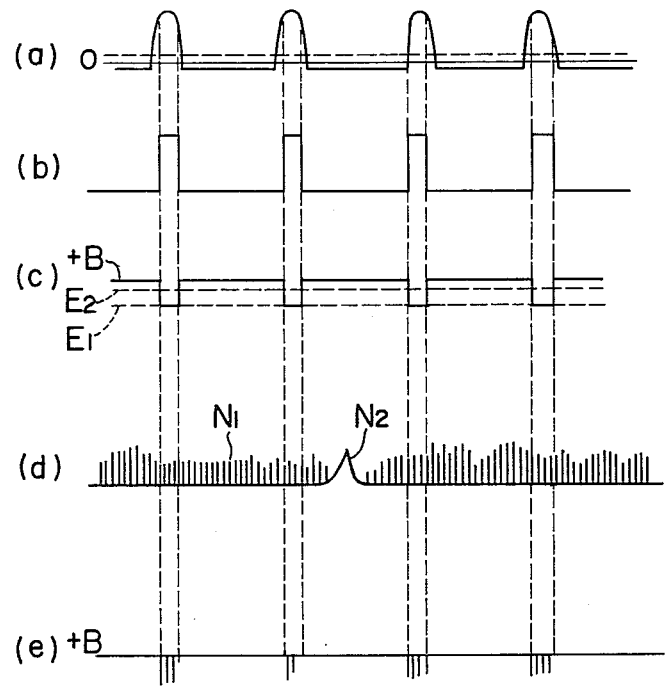
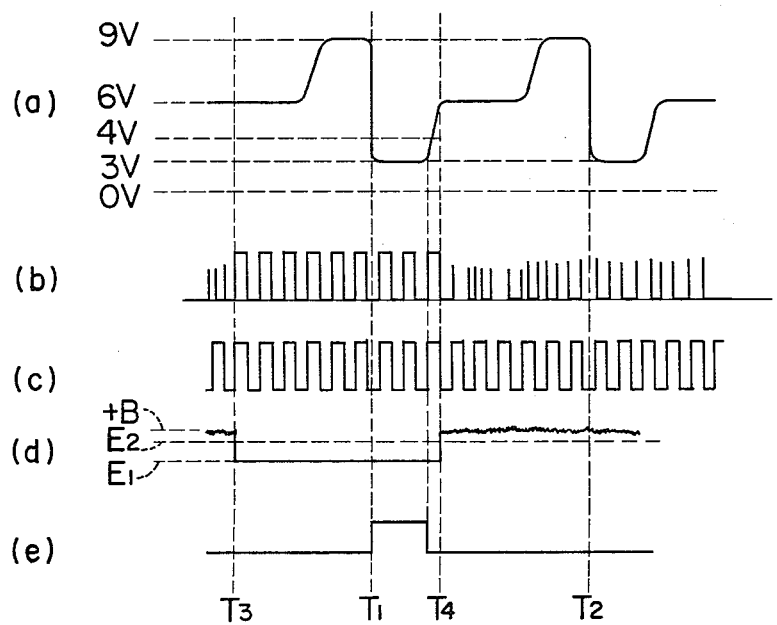

CHANNEL SELECTION SYSTEM FOR TELEVISION RECEIVER

The present invention relates to a channel selection system which stops the frequency sweep when a frequency of a received video carrier which has been frequency-converted to a video intermediate frequency coincides with a video intermediate carrier frequency during the frequency sweep.

When the frequency sweep is carried out from a low frequency channel to a high frequency channel in order to select a desired receiving channel, the frequency of the video carrier which has been frequency-converted to the video intermediate frequency and the frequency of the audio carrier alternately coincides with the video intermediate carrier frequency in the sequence of a first channel video carrier, a first channel audio carrier, a second channel video carrier, a second channel audio carrier, a third channel video carrier, a third channel audio carrier and so on. In order to determine whether the received carrier which coincides with the video intermediate carrier frequency is the video carrier or the audio carrier, the prior art system determines the received carrier by the presence or absence of a sync. pulse in an output from a sync. separator. Namely, the channel selection system determines the received carrier as the video carrier when the sync. pulse is present and stops the frequency sweep in response thereto. For example, assuming that the channel selection system frequency-sweeps from a channel #1 toward a high frequency channel and the broadcasting channels which can be received include channels #1, #3 and #5, when the channel selection system receives the channel #3, it identifies the second received carrier which results in the sync. pulse, as the channel #3.

Since the output of the sync. separator may include a pulse due to a noise pulse, however, if such a pulse due to the noise pulse is included in the output of the sync. separator when the audio carrier is received, the channel selection system erroneously identify the audio carrier as the video carrier resulting in an erroneous operation.

It is an object of the present invention to provide a channel selection system which is highly insensitive to the noise pulse.

In order to attain the above object, according to the present invention, there is provided a television receiver which includes a presence of carrier identification means operable to stop the frequency sweep in response to a carrier component of each channel applied to a video intermediate frequency amplifier stage in time sequence during the frequency sweep operation for selecting a desired one of a plurality of television signal channels each including a video carrier and an audio carrier, wherein an enable control means is provided which is supplied with a horizontal flyback pulse together with a sync. pulse which has been sync. separated to enable the presence of carrier identification means only when those pulses are supplied simultaneously or in a predetermined time relation.

FIG. 1 is a block diagram showing one embodiment of a television receiver channel selection system in accordance with the present invention;

FIGS. 2 and 3a–e, show voltage waveforms at various points in FIG. 1; and

Figure 4:
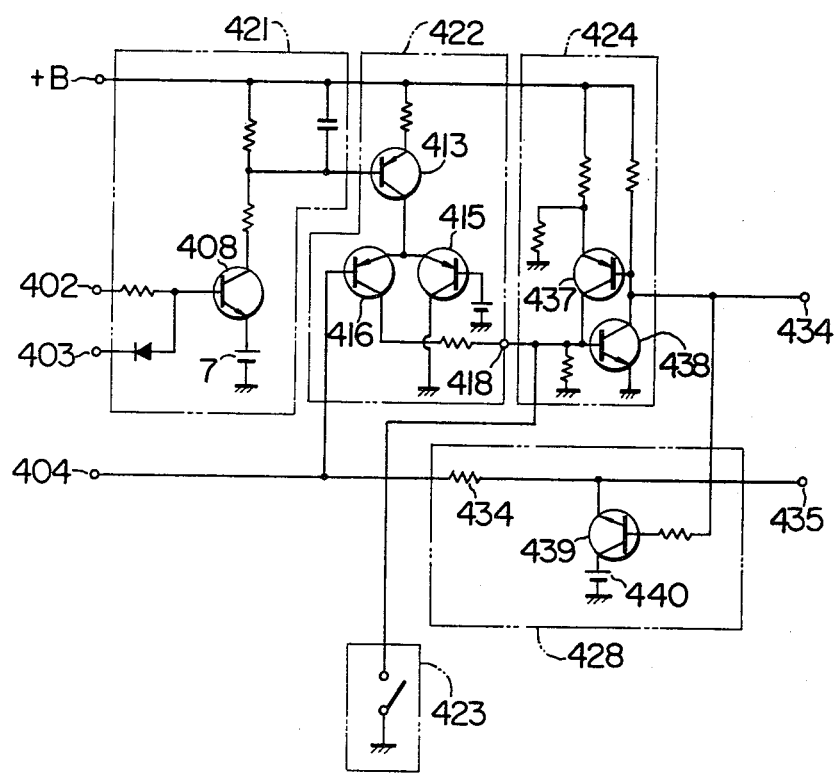

FIG. 4 shows a circuit diagram of a portion of another embodiment of the television receiver channel selection system of the present invention.

Referring to FIG. 1, switches 12 and 14 constitutes a switch unit 10 and are operated in a ganged manner. The television receiver operates as a normal color television receiver when the switches 12 and 14 are thrown to the opposite positions to those shown in FIG. 1. A desired receiving channel is selected in such a manner that a viewer designates a 14-bit selection signal stored in a memory 100 by a memory designator 110 in a manner to be described later. The designated selection signal is supplied through an interface 120 to a 12-bit binary counter 130 which counts from decimal 0 to $2^{12}-1$ and a 2-bit binary counter 132 which count from decimal 0 to 3 to set the counts of the binary counters 130 and 132. A 2-bit output signal from the binary counter 132 is fed to a tuner 16 and the count thereof designates the receiving band of the tuner 16 to thereby select one of a VHF low band including channels #1 to #3, a VHF high band including channels #4 to #12 and a UHF band. A 12-bit output signal from the binary counter 130 is fed to a pulse width modulator 150 to which a pulse signal at 1.8 MHz is supplied from a pulse generator 140, so that a pulse signal at 1.8 MHz having a pulse width corresponding to the count of the counter 130 is produced at an output of the pulse width modulator 150. The pulse width-modulated pulse signal is converted to a D.C voltage by a smoothing circuit 160, which voltage is fed to the tuner 16 as a tuning voltage, the magnitude of which depends on the count in the binary counter 130. In this manner, a specific channel band and a specific channel in that channel band are selected by the viewer. A frequency discriminator 20 connected to a video intermediate frequency amplifier 18 detects a deviation of a video carrier frequency amplified by the video intermediate frequency amplifier 18, from a video intermediate frequency carrier frequency and supplies a detection signal representative of the deviation to the tuner 16 to thereby stabilize the tuning frequency by this feedback loop. A video detector 22, a sync. separator 24 for separating a sync. pulse, a deflection circuit 26 for generating a horizontal flyback pulse and carrying out horizontal and vertical deflections, a high voltage generator 28, a video amplifier 30 and a chrominance signal processing circuit 32 operate in conventional manner to reproduce a color image on a color picture tube 34.

When the switch unit 10 is thrown to the illustrated position, the frequency sweep operation is carried out and a 14-bit information for designating a channel band and a tuning voltage for a channel to be received is stored in the memory 100. At this time, a fixed voltage +B' which is equal to a center voltage for an S-characteristic of the frequency discriminator 20 is applied to the tuner 16 and an output voltage of the frequency discriminator 20 is supplied to a detector 180.

For simplifying the explanation, it is assumed in the following explanation that an emitter of a transistor 302 in a control unit 300 which controls the activation and deactivation of a discriminator 170 is directly grounded. A horizontal flyback pulse train as shown in FIG. 2(a) is applied to a base of the transistor 302, and a sync. pulse train as shown in FIG. 2(b) is applied through a coil 306 to a base of a transistor 304 having its collector-emitter path connected in series with the collector-emitter path of the transistor 302. The coil 306 serves to delay the sync. pulse from the sync. separator 24 which sync. pulse is generated earlier than the horizontal flyback pulse so that the sync. pulse and the horizontal flyback pulse are simultaneously applied to the bases of the transistors 304 and 302, respectively. As the count in the counter 130 increases from 0 to $2^{12}-1$, a tuning voltage applied to a voltage dependent variable capacitance element such as a variable capacitance diode which constitutes a tuning circuit of the tuner 16 changes, for example, from 0 volt to 30 volts to carry out the frequency sweep. During the frequency sweep operation, the receiving frequency of the tuner 16 sequentially scans the video carrier frequencies and the audio carrier frequencies of the respective channels. When a video carrier is received and the video carrier frequency which has been frequency-converted to the video intermediate frequency is within a pass band of a selectivity characteristic of the video intermediate frequency amplifier 18, the sync. separator 24 generates the sync. pulse and the deflection circuit 26 generates the horizontal flyback pulse in response to the sync. pulse. As a result, both the transistors 302 and 304 are turned on so that a pulse voltage as shown in FIG. 2(c) develops at the collector of the transistor 304. This pulse voltage is smoothed by a capacitor 309 to a D.C. voltage $E_1$, which is lower than a voltage $E_2$, which voltage $E_1$ is supplied to the discriminator 170. The discriminator 170 is deactivated when the potential at the collector of the transistor 304 is higher than the voltage $E_2$ and activated when it is lower than the voltage $E_2$. On the other hand, when the video carrier is not being received, the sync. pulse is not generated and the transistor 304 is non-conductive. Therefore, the collector voltage of the transistor 304 is equal to $+B$. Even if the transistor 304 is biased to the voltage enough to be conducted by a noise which is hard to be distinguished from the sync. pulse, the transistor 304 is not turned on except when the transistor 302 is turned on by the horizontal flyback pulse. Accordingly, even if noise $N_1$ or $N_2$ as shown in FIG. 2(d) is supplied to the transistor 304, the transistor 304 develops a voltage as shown in FIG. 2(e) at the collector thereof, and the D.C. voltage at the collector does not appreciably drop from the voltage $+B$. Accordingly, even if the transistor 304 is turned on by a noise when the audio carrier is being received, the D.C. voltage at the collector of the transistor 304 does not drop to the voltage $E_2$ and the discrimator 170 is not activated. Therefore, there is no risk that the audio carrier is erroneously identified as the video carrier.

The counter 130 counts the pulses from the pulse generator 140 and a tuning voltage proportional to the count is supplied to the tuner 16. During the frequency sweep operation, the frequency of the received video carrier which has been frequency-converted to the video intermediate frequency approaches the video intermediate frequency carrier frequency, moves past that frequency and moves away from that frequency. Then, the frequency of the received audio carrier which coexists with the received video carrier and which has been frequency-converted to the video intermediate frequency approaches the video intermediate frequency carrier frequency, moves past that frequency and moves away from that frequency. As a result, the frequency discriminator 20 produces a voltage waveform as shown in FIG. 3(a), in which time $T_1$ indicates the time when the received video carrier which has been frequency converted to the intermediate video frequency coincides with the video intermediate frequency carrier frequency, and a time $T_2$ indicates the time when the received audio carrier which has been frequency-converted to the video intermediate frequency coincides with the video intermediate frequency carrier frequency.

Before the video carrier is received by the frequency sweep, the output of the frequency discriminator 20 is at 6 volts, and as the frequency of the received video carrier which has been frequency-converted to the video intermediate frequency moves in the pass band of the video intermediate frequency amplifier 18, the output voltage of the frequency discriminator 20 changes about between 9 volts and 3 volts in accordance with the S-characteristic of the frequency discriminator 20. Then, as the frequency of the received audio carrier which has been frequency-converted to the video intermediate frequency moves in the pass band of the video intermediate frequency amplifier 18, the output voltage of the frequency discriminator 20 changes about between 9 volts and 3 volts.

Since the sync. pulse is generated only when the frequency of the received video carrier which has been frequency-converted to the video intermediate frequency is within the pass band of the video intermediate frequency amplifier 18, the sync. separator 24 produces a voltage waveform as shown in FIG. 3(b) as the frequency sweep occurs. The time period from a time $T_3$ at which the sync. pulse begins to be generated to the time $T_1$ is longer than the time period from the time $T_1$ to a time $T_4$ at which the sync. pulse ceases to be generated because of the selectivity characteristic of the video intermediate frequency amplifier.

On the other hand, the deflection circuit 26 constantly produces the horizontal flyback pulse as shown in FIG. 3(c), and the control unit 300 produces a control voltage as shown in FIG. 3(d) as described above so that the discriminator 170 is enabled during the time period from the time $T_3$ to the time $T_4$.

The detector 180 comprises a high level detector 182 which includes a zener diode 163 having a breakdown voltage of 7 volts and a transistor 184, and a low level detector 186 which includes a zener diode 187 having a breakdown voltage of 4 volts and a transistor 188.

When the carrier is not being received, the transistor 184 is non-conductive while the transistor 188 is conductive because of the breakdown voltages of the zener diodes 163 and 187. When the video carrier is received, the output voltage of the frequency discriminator 20 exhibits a first rising step changing from 6 volts to 9 volts, a second falling step changing from 9 volts to 3 volts and a third rising step changing from 3 volts to 6 volts. At the end of the first step the transistors 184 and 188 are conductive, and at the end of the second step the transistors 184 and 188 are non-conductive. Thus, when the transistor 184 changes from the non-conductive state to the conductive state, the occurrence of the high level is detected, and also when the transistor 188 changes from the conductive state to the non-conductive state, the occurrence of the low level is detected. As those high and low levels are generated in time sequence, the discriminator 170 supplies a stop sweep signal to the counter 130 to stop the counting operation of the counter 130. A synthesizer 190 synthesizes the 12-bit count in the counter 130 and the 2-bit count in the counter 132 to produce a 14-bit designation signal which is fed through the interface 120 to the memory 100 and stored therein. When the storing operation completes, the counter 130 again starts to count and the sweep operation is started. The counter 132 counts up the number of times of the counting cycles from 0 to $2^{12}-1$ executed by the counter 130 to thereby designate a band.

The transistor 308 connected between the emitter of the transistor 302 and ground and a filtering circuit 200 connected between the base of the transistor 308 and the pulse width modulator 150 function to prevent the following situation.

When the count in the counter 130 is reset from $2^{12}-1$ to 0, for example, when the sweep in the VHF low band is completed and the sweep in the VHF high band is to be started, it takes a finite time before the sweep voltage drops because of the time constant of the filtering circuit 160 and so on, so that a stop signal is generated from the discriminator 170 in the course of the drop of the sweep voltage. On the other hand, the count in the counter 130 is instantaneously reset to zero when the count in the counter 130 is reset. As a result, a 12-bit signal indicative of an undesirable small count is stored in the memory 100 as the designation signal. However, since the transistor 308 is not turned on before the base voltage thereof exceeds 0.7 volt, for example, the control unit 300 keep the discriminator 170 deactivated when the count of the counter is small. In this manner, the undesired information is prevented from being stored in the memory 100 when the band is switched.

FIG. 4 shows a circuit diagram of a portion of another embodiment of the channel selection system of the present invention.

Referring to FIG. 4, a positive sync. pulse is applied to an input terminal 402 and a positive horizontal flyback pulse is applied to an input terminal 403. As a result, a collector voltage of a transistor 408 in a first AND circuit 421 is low only during the time period $T_3-T_4$ in FIG. 3(b) so that a transistor 413 in a second AND circuit 422 is turned on. An AFC voltage shown in FIG. 3(a) which is applied to an input terminal 404 from the frequency discriminator 20 is fed to a base of a transistor 416, and a fixed voltage of 4 volts is supplied to a base of the transistor 415. Accordingly, a pulse voltage as shown in FIG. 3(e) is produced at an output terminal 418 of the second AND circuit 422.

During the channel selection operation, when a reset type channel selection switch 423 is depressed to apply an off signal to a base of a transistor 438, thyristor-connected transistors 437 and 438 are rendered non-conductive and a potential equal to the power supply voltage +B appears at an output terminal 434 of a stop selection command circuit 424. On the other hand, when the detection signal shown in FIG. 3(e) appears at an output terminal 418 of the second AND circuit 422, the transistors 437 and 438 are rendered conductive and the potential at the output terminal 434 assumes substantially zero. The channel selection system carries out the frequency sweep when the potential at the terminal 434 is at +B and stops the frequency sweep when the potential at the terminal 434 is zero.

When the output voltage of the stop selection command circuit 424 is equal to +B, a transistor 439 in an AFC switch 428 conducts so that an AFC fixed voltage from the power supply 440 appears at an output terminal 435. A resistor 436 serves to prevent the AFC voltage supplied to an input terminal from being affected by the AFC switch 428 and to cause it to be applied to a base of a transistor 416. Upon tuning, when the detection signal is produced to cause an input voltage to a base of a transistor 439 to be zero to turn off the transistor 439, the AFC voltage appears at the terminal 435 through the resistor 436.

What we claim is:

1. In a channel selection system for a television received comprising:
  a tuner operatively tuned to an active station for receiving a television broadcasting signal of said tuned active station and for converting said received television broadcasting signal to a video intermediate frequency signal;
  band scan means for causing said tuner to search for an active station over a predetermined television frequency band;
  a voltage generator supplied with said video intermediate frequency signal for generating a voltage as a function of the frequency difference between said video intermediate frequency signal and a reference frequency; and
  a sync separator for separating from said video intermediate frequency signal a sync pulse;
  the improvement comprising:
    a first detector connected to said voltage generator for generating a first detection signal when it detects a voltage change of said voltage from said maximum value to said minimum value, and vice versa;
    a second detector connected to said sync separator for generating a second detection signal when said sync pulse is generated in said sync separator; and
    a stopping means for stopping scanning a receiving frequency of said tuner and holding said receiving frequency of said tuner at the frequency said band scan means stops scanning, when all of said first and second detection signals are supplied thereto.

2. In a channel selection system for a television receiver comprising:
  a tuner operatively tuned to an active station for receiving a television broadcasting signal of said tuned active station and for converting said received television broadcasting signal to a video intermediate frequency signal;
  band scan means for causing said tuner to search for an active station over a predetermined television frequency band;
  a voltage generator supplied with said video intermediate frequency signal for generating a voltage as a function of the frequency difference between said video intermediate frequency signal and a reference frequency;
  horizontal scan means for scanning a television raster in the horizontal direction in a horizontal scan period and for generating a horizontal flyback pulse in a horizontal retrace period, both said horizontal scan and retrace periods being in synchronism with a control pulse supplied thereto; and
  a sync separator for separating from said video intermediate frequency signal a sync pulse which is supplied to said horizontal scan means as the control pulse;
  the improvement comprising:
    a first detector connected to said voltage generator for generating a first detection signal when said voltage is generated in said voltage generator;
    a second detector connected to said sync separator for generating a second detection signal when said sync pulse is generated in said sync separator;

a third detector connected to said horizontal scan means for generating a third detection signal when said horizontal flyback pulse is generated in said horizontal scan means; and a stopping means for stopping the operation of said band scan means so as to cause said tuner to receive a frequency signal at which said band scan means stops scanning when all of said first, second and third detection signals are supplied thereto.

3. A channel selection system for a television receiver according to claim 2, wherein said first detector generates said first detection signal when it detects a voltage change of said voltage from said maximum value to said minimum value, and vice versa.

4. In a channel selection system for a television receiver comprising:

a tuner operatively tuned to an active station for receiving a television broadcasting signal of said tuned active station and for converting said received television broadcasting signal to a video intermediate frequency signal;

band scan means for causing said tuner to search for an active station over a predetermined television frequency band;

a voltage generator supplied with said video intermediate frequency signal for generating a voltage as a function of the frequency difference between said video intermediate frequency signal and a reference signal;

horizontal scan means for scanning a television master in the horizontal direction in a horizontal scan period and for generating a horizontal flyback pulse in a horizontal retrace period, both said horizontal scan and retrace periods being in synchronism with a control pulse supplied thereto; and a sync separator for separating from said video intermediate frequency signal a sync pulse which is supplied to said horizontal scan means as the control pulse;

the improvement comprising:

a first detector connected to said voltage generator and said band scan means for generating a first detection signal which is supplied to said band scan means to stop scanning said receiving frequency, when said voltage is generated in said voltage generator;

a second detector connected to said sync separator for generating a second detection signal when said sync pulse is generated in said sync separator;

a third detector connected to said horizontal scan means for generating a third detection signal when said horizontal flyback pulse is generated in said horizontal scan means; and control means for causing said first detector to be operative when said second and third detection signal are supplied simultaneously thereto and for causing said first detector to be inoperative when said second and third detection signals are not supplied simultaneously thereto.

5. A channel selection system for a television receiver according to claim 4, wherein said first detector generates said first detection signal when it detects a voltage change of said voltage from said maximum value to said minimum value, and vice versa.

6. A channel selection system for a television receiver according to claim 4, wherein said second detector and said third detector means includes first and second series connected switching elements respectively adapted to be actuated by said sync pulse and said horizontal flyback pulse, respectively, and delay means connected between said first switching element and said sync separator means and between said second switching element and said horizontal flyback pulse generating means, respectively, to simultaneously supply the sync pulse and the horizontal flyback pulse which is in synchronism with said sync pulse to said first and second switching elements, respectively, whereby said control means is caused to be operative when said first and second switching elements are simultaneously actuated.

7. A channel selection system for a television receiver according to claim 6, wherein said first detector comprises a maximum voltage detector for generating a fourth detection signal when said voltage equals to said maximum voltage, a minimum voltage detector for generating a fifth detection signal when said voltage equals to said minimum voltage, and a generator for generating said first detection signal when both of said fourth and fifth detection signals are supplied thereto.

8. A channel selection system for a television receiver according to claim 6, wherein said first and second switching elements each comprises a transistor adapted to be turned on in response to a pulse, said delay means comprises a pulse delay means connected between a control electrode of one of said transistor and said sync separator means and a non-delaying connection means connected between a control electrode of the other of said transistor and said horizontal flyback pulse generating means, said one and the other transistors being connected in series, to which a load circuit is connected so that a voltage developed across said load circuit is applied to said control means.

9. A channel selection system for a television receiver according to claim 8, wherein said load circuit comprises a parallel circuit of a resistor and a capacitor.

10. A channel selection system for a television receiver according to claim 8, wherein said first detector comprises a maximum voltage detector for generating a fourth detection signal when said voltage equals to said maximum voltage, a minimum voltage detector for generating a fifth detection signal when said voltage equals to said minimum voltage, and a generator for generating said first detection signal when both of said fourth and fifth detection signals are supplied thereto.

* * * * *